US008718418B2

(12) United States Patent
Haefner et al.

(10) Patent No.: US 8,718,418 B2
(45) Date of Patent: May 6, 2014

(54) HIGH VOLTAGE AC/DC OR DC/AC CONVERTER STATION WITH FIBER-OPTIC CURRENT SENSOR

(75) Inventors: Juergen Haefner, Ludvika (SE); Andreas Frank, Zurich (CH); Klaus Bohnert, Oberrohrdorf (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 13/014,969

(22) Filed: Jan. 27, 2011

(65) Prior Publication Data

US 2011/0122654 A1 May 26, 2011

Related U.S. Application Data

(63) Continuation of application No. PCT/EP2008/059983, filed on Jul. 30, 2008.

(51) Int. Cl.
*G02B 6/00* (2006.01)

(52) U.S. Cl.
USPC .............................. 385/12; 324/96

(58) Field of Classification Search
USPC .............................. 385/12; 324/96
See application file for complete search history.

(56) References Cited

U.S. PATENT DOCUMENTS

| | | | |
|---|---|---|---|
| 1,198,018 A | | 9/1916 | Fortescue |
| 3,378,731 A | | 4/1968 | Whitehead |
| 4,253,061 A | * | 2/1981 | Ono et al. ....................... 324/96 |
| 4,328,461 A | * | 5/1982 | Butters et al. ................. 324/72 |
| 4,542,338 A | * | 9/1985 | Arditty et al. ............. 324/117 R |
| 4,578,639 A | * | 3/1986 | Miller .............................. 324/96 |
| 4,742,197 A | | 5/1988 | Mauthe |
| 4,797,607 A | * | 1/1989 | Dupraz ............................ 324/96 |
| 4,894,608 A | * | 1/1990 | Ulmer, Jr. ......................... 324/96 |
| 4,928,067 A | * | 5/1990 | Lind ............................... 324/96 |
| 5,063,472 A | * | 11/1991 | van Doan et al. .............. 361/19 |
| 5,124,634 A | * | 6/1992 | Ulmer, Jr. et al. .............. 324/96 |
| 5,136,236 A | | 8/1992 | Bohnert et al. |
| 5,202,812 A | * | 4/1993 | Shinoda et al. ................. 361/65 |
| 5,295,207 A | | 3/1994 | Dupraz et al. |

(Continued)

FOREIGN PATENT DOCUMENTS

| | | |
|---|---|---|
| DE | 40 25 911 | 4/1991 |
| DE | 44 26 699 | 2/1996 |

(Continued)

OTHER PUBLICATIONS

Siemens, High Voltage Direct Current Transmission—Proven Technology for Power Exchange; http://web.archive.org/web/20070217073457/http://www.ewh.ieee.org/r6/san_francisco/pes/pes_pdf/HVDC_Technology.pdf.*

(Continued)

*Primary Examiner* — Charlie Peng
*Assistant Examiner* — Peter Radkowski
(74) *Attorney, Agent, or Firm* — Buchanan Ingersoll & Rooney PC

(57) ABSTRACT

DC current in a high voltage AC/DC or DC/AC converter station can be measured via the Faraday effect in one or more loops of an optical sensing fiber located at the base of a bushing extending through a wall of the hall. This arrangement can exploit the base of the bushing being at ground potential, which can simplify mounting work and maintenance.

30 Claims, 5 Drawing Sheets

(56) References Cited

U.S. PATENT DOCUMENTS

| | | | |
|---|---|---|---|
| 5,600,550 A * | 2/1997 | Cook, II | 363/50 |
| 5,645,622 A | 7/1997 | Cronk et al. | |
| 5,844,410 A * | 12/1998 | Ikuta et al. | 324/96 |
| 5,933,000 A | 8/1999 | Bosselmann et al. | |
| 5,953,121 A | 9/1999 | Bohnert et al. | |
| 6,175,167 B1 | 1/2001 | Lorenz et al. | |
| 6,389,211 B1 | 5/2002 | Mandry et al. | |
| 6,433,981 B1 * | 8/2002 | Fletcher et al. | 361/93.1 |
| 6,522,256 B2 * | 2/2003 | Panto et al. | 340/660 |
| 6,636,321 B2 | 10/2003 | Bohnert | |
| 6,731,115 B2 * | 5/2004 | Saitoh | 324/424 |
| 6,734,657 B2 | 5/2004 | Bohnert et al. | |
| 7,339,680 B2 | 3/2008 | Bohnert et al. | |
| 7,450,792 B2 | 11/2008 | Bohnert et al. | |
| 7,723,977 B2 * | 5/2010 | Blake et al. | 324/96 |
| 2001/0010452 A1 * | 8/2001 | Moriarty | 318/700 |
| 2002/0000802 A1 * | 1/2002 | Panto et al. | 324/117 R |
| 2002/0053911 A1 * | 5/2002 | Saitoh | 324/424 |
| 2002/0180416 A1 | 12/2002 | Dyott | |
| 2005/0083033 A1 * | 4/2005 | Kurosawa et al. | 324/96 |
| 2005/0088662 A1 * | 4/2005 | Bohnert et al. | 356/483 |
| 2006/0153509 A1 * | 7/2006 | Bohnert et al. | 385/101 |
| 2007/0041568 A1 * | 2/2007 | Ghoshal et al. | 379/324 |
| 2007/0052971 A1 | 3/2007 | Bohnert et al. | |
| 2007/0116403 A1 * | 5/2007 | Blemel | 385/12 |
| 2008/0303510 A1 * | 12/2008 | Blake et al. | 324/96 |
| 2011/0062944 A1 * | 3/2011 | Sorensen | 324/96 |

FOREIGN PATENT DOCUMENTS

| | | | |
|---|---|---|---|
| DE | 196 08 285 | | 8/1997 |
| DE | 10005164 A1 * | | 8/2001 |
| EP | 0 156 533 A1 | | 10/1985 |
| EP | 0156533 A1 | | 10/1985 |
| EP | 0 237 776 | | 9/1987 |
| EP | 596566 A2 * | | 5/1994 | H02H 7/04 |
| EP | 0785439 A2 | | 7/1997 |
| EP | 1154278 B1 | | 10/2004 |
| EP | 1 624 311 A1 | | 2/2006 |
| EP | 1624311 A1 | | 2/2006 |
| EP | 1 710 589 | | 10/2006 |
| EP | 1115000 B1 | | 12/2006 |
| EP | 1512981 B1 | | 10/2007 |
| FR | 2 680 919 A1 | | 3/1993 |
| FR | 2680919 A1 | | 3/1993 |
| JP | 61-034469 A | | 2/1986 |
| JP | 61-202172 A | | 9/1986 |
| JP | 61202172 A * | | 9/1986 |
| JP | 07-107746 A | | 4/1995 |
| JP | 07107746 A * | | 4/1995 |
| JP | 07-174792 A | | 7/1995 |
| JP | 07-234252 A | | 9/1995 |
| JP | 09-196974 A | | 7/1997 |
| JP | 10-227814 A | | 8/1998 |
| JP | 2002-303643 A | | 10/2002 |
| JP | 2007-537424 A | | 12/2007 |
| JP | 2008-113516 A | | 5/2008 |
| WO | WO 2005/111633 A1 | | 11/2005 |

OTHER PUBLICATIONS

Bohnert et al., Highly Accurate Fiber-Optic DC Current Sensor for the Electrowinning Industry, IEEE Transactions on Industry Applications, vol. 43, No. 1, Jan. 2007, p. 180.*

Hochlehnert et al., U.S. Appl. No. 13/016,693, entitle "Generator Circuit Breaker with Fiber-Optic Current Sensor" filed Jan. 28, 2011.

International Search Report (Form PCT/ISA/210) and the Written Opinion of the International Searching Authority (Form PCT/ISA/237) dated Apr. 17, 2009, issued in the corresponding European Patent International Application No. PCT/EP2008/059984.

International Search Report (PCT/ISA/210) issued on Jan. 28, 2009, by European Patent Office as the International Searching Authority for International Application No. PCT/EP2008/059983.

Written Opinion (PCT/ISA/237) issued on Jan. 28, 2009, by European Patent Office as the International Searching Authority for International Application No. PCT/EP2008/059983.

K. Bohnert et al., Temperature and Vibration Insensitive Fiber-Optic Current Sensor, Journal of Lightwave Technology, vol. 20, No. 2, Feb. 2002, pp. 267-276.

Klaus Bohnert et al., Highly Accurate Fiber-Optic DC Current Sensor for the Electrowinning Industry, IEEE Transactions on Industry Applications, vol. 43, No. 1, Jan./Feb. 2007, pp. 180-187.

Ralph A. Bergh et al., An Overview of Fiber-Optic Gyroscopes, Journal of Lightwave Technology, vol. LT-2, No. 2, Apr. 1984, pp. 91-107.

Herve Lefevre, The fiber-optic gyroscope, Artech House, Boston, London, 1993.

Richard I. Laming at al., Electric Current Sensors Employing Spun Highly Birefringent Optical Fibers, Journal of Lightwave Technology, vol. 7 No. 12, Dec. 1989, pp. 2084-2094.

Klaus Bohnert et al., Fiber-Optic Current Sensor for Electrowinning of Metals, Journal of Lightwave Technology, vol. 25, No. 11, Nov. 2007, pp. 3602-3609.

Gunnar Fernqvist, The Measurement Challenge of the LHC Project, IEEE Transactions of Instrumentation and Measurement, vol. 48, No. 2, Apr. 1999, pp. 462-466.

Gunnar Asplund, Ultra high voltage transmission, ABB Review, Feb. 2007pp. 23-27.

Kiyoshi Kurosawa et al., Polarization Properties of the Flint Glass Fiber, Journal of Lightwave Technology, vol. 13, No. 7, Jul. 1995, pp. 1378-1384.

Office Action dated Aug. 21, 2012, issued in corresponding Japanese Patent Application No. 2011-520328. (3 pages).

International Search Report (Form PCT/ISA/210) and the Written Opinion of the International Searching Authority (Form PCT/ISA/237) dated Jan. 28, 2009, issued in corresponding International Application No. PCT/EP2008/059983. (10 pages).

Asplund, "Ultra High Voltage Transmission Alternative Scenarios for Long Distance Bulk Power Transmission—800kV and HVDC and 1000kV HVAC" Energy Efficient Grids, ABB Review, (Feb. 2007), pp. 23-27.

Fernqvist, "The Measurement Challenge of the LHC Project" IEEE Transactions on Instrumentation and Measurement, (Apr. 1999), vol. 48, No. 2, pp. 462-466.

Notice of Allowance issued Sep. 17, 2013 in related U.S. Appl. No. 13/016,693.

* cited by examiner

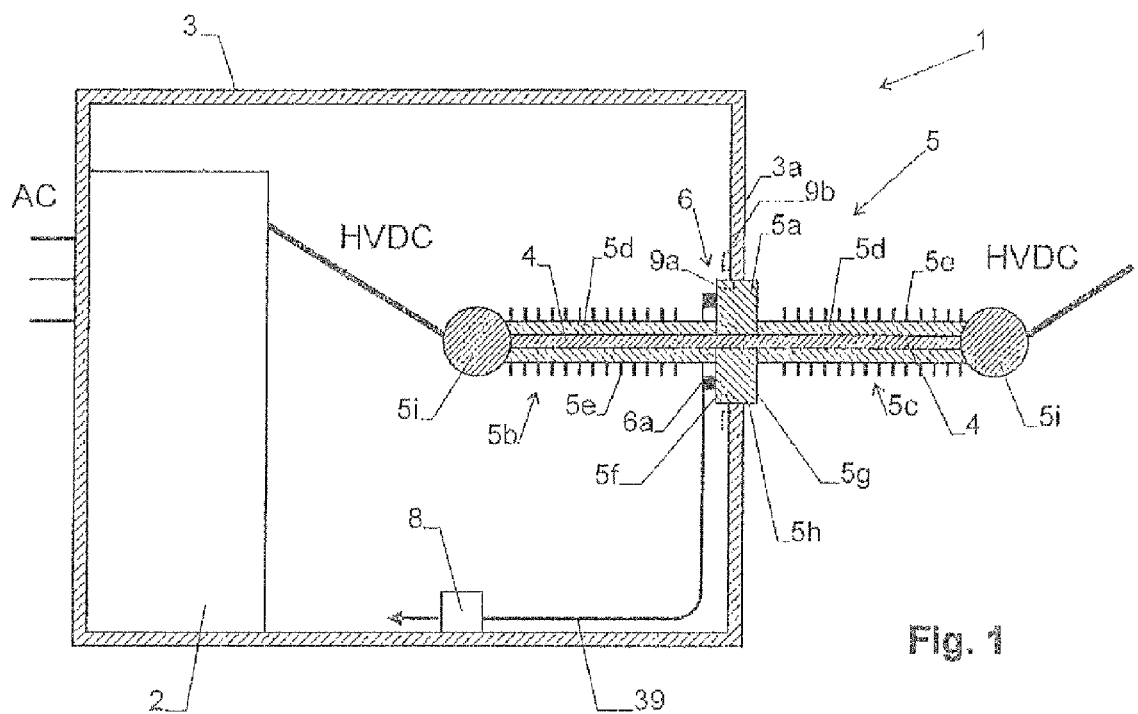
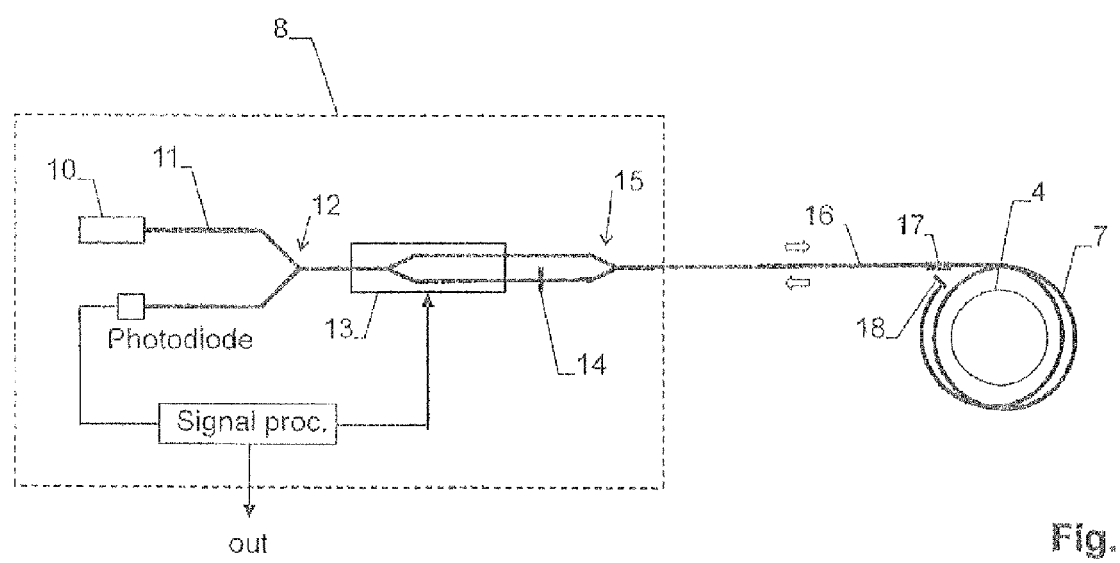

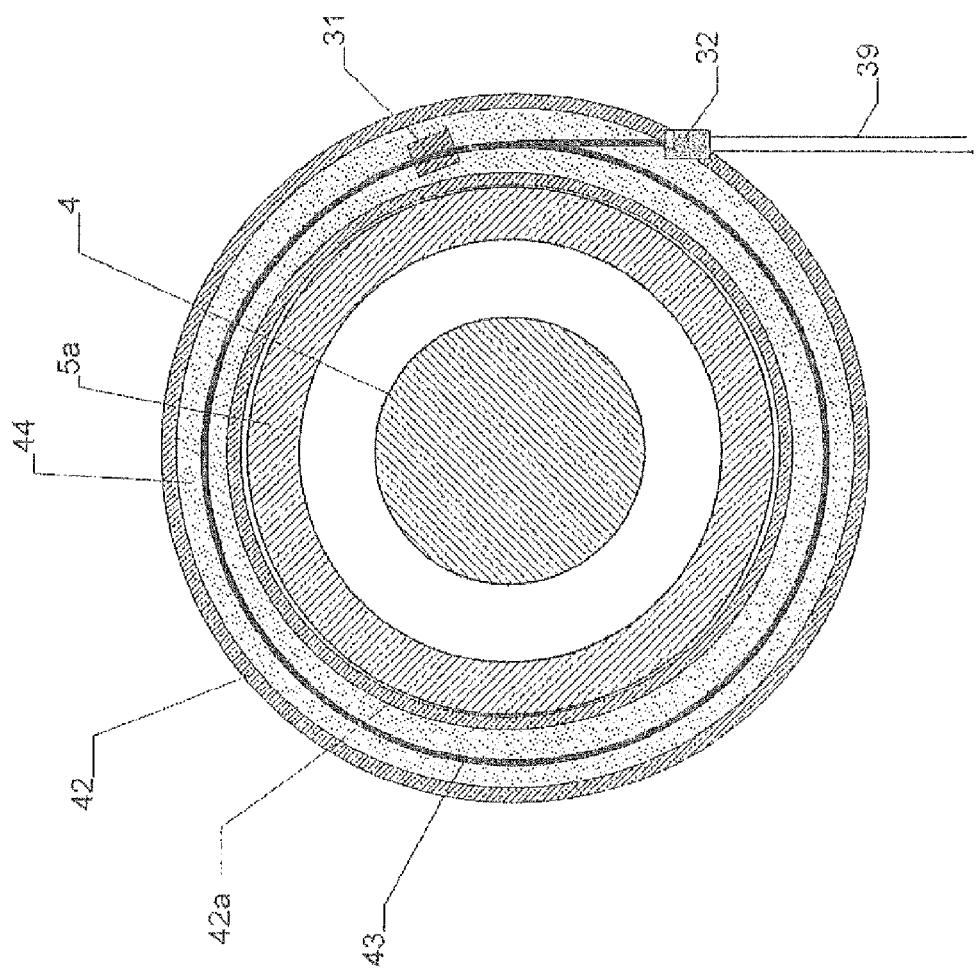
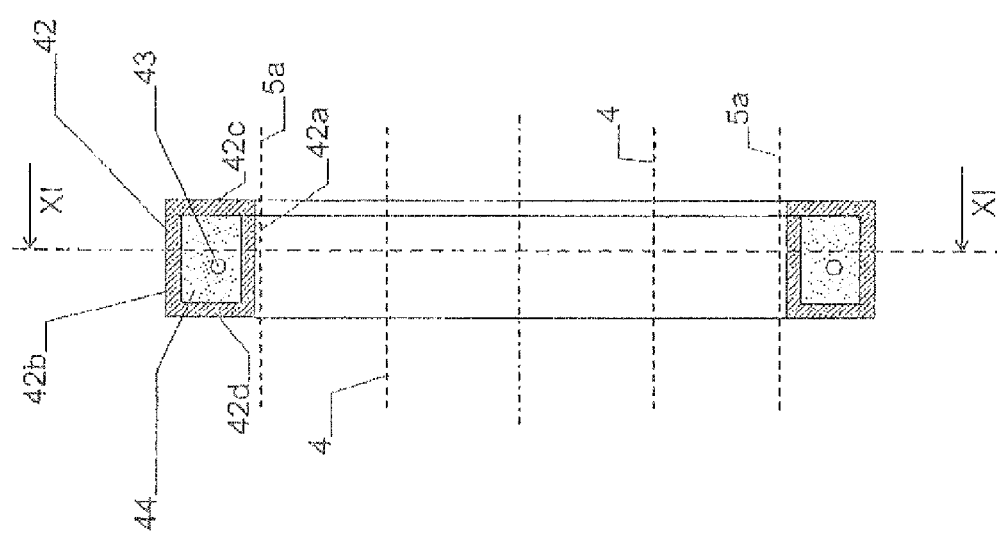

US 8,718,418 B2

HIGH VOLTAGE AC/DC OR DC/AC CONVERTER STATION WITH FIBER-OPTIC CURRENT SENSOR

RELATED APPLICATIONS

This application claims priority as a continuation application under 35 U.S.C. §120 to PCT/EP2008/059983 filed as an International Application on Jul. 30, 2008 designating the U.S., the entire content of which is hereby incorporated by reference in its entirety.

FIELD

The disclosure relates to a high voltage AC/DC or DC/AC converter station, such as a converter station having a hall with a bushing extending through a wall of the hall, and a fiber-optic current sensor.

BACKGROUND INFORMATION

AC/DC or DC/AC converter stations include equipment for converting between high voltage DC and AC currents and are used for electric power transmission, where exemplary DC voltages can be on the order of several 100 kV. The desire arises to measure the DC currents in such converter stations.

Known direct current measurement in high-voltage direct current (HVDC) electric power transmission systems utilizes DC Current Transformers (DCCT) based on automatic DC ampere-turn balancing of primary and secondary currents through zero-flux detection in a transformer magnetic core (Ref. 11). Electrical insulation of DCCTs by paper and oil from high-voltage potential can result in bulky equipment mounted on porcelain insulators.

Optical DCCTs utilising optical fibres for electrical insulation can eliminate the risk of flashover, explosion and environmental hazards due to the application of oil-filled porcelain insulators.

State of the art in HVDC measurement are optical DCCTs based on low-ohmic resistive current sensors included in the primary current circuit. An optoelectronic module placed together with the current shunt at high-voltage potential samples and converts the measured current-dependent resistive voltage drop into a serial data stream. The serial data are transmitted as an optical digital signal via the optical fibre link to the interface in the control room. Power to supply the optoelectronic module can be simultaneously transmitted as laser light from the interface to the current transducer.

The cooling capability of the current transducer housing can limit the thermal current rating of known optical DCCTs for a given design of the current sensor.

The design of fiber-optic current sensors is almost independent of the thermal currents specified for measuring apparatus for HVDC bulk power transmission.

Ref. 1 discloses a concept for stress-free packaging and orientation of the sensing fiber of a fiber-optic current sensor (e.g., for precise measurement of high direct currents at aluminum smelters).

SUMMARY

An AC/DC or DC/AC converter station, comprising: a converter for converting an AC voltage to a DC voltage or vice versa; a hall arranged around said converter; a bushing having a conductor for leading a DC voltage through a wall of said hall, said bushing comprising a base connected to said wall and arms extending from opposite sides of said base and carrying connecting electrodes; and at least one current sensor for measuring a current through said conductor at said DC voltage, wherein said current sensor comprises an optical sensing fiber and an optoelectronic module for measuring said current via a Faraday effect in said sensing fiber, wherein said sensing fiber is looped around said conductor and arranged at said base and/or said wall around said base.

BRIEF DESCRIPTION OF THE DRAWINGS

Additional refinements, advantages and features of the present disclosure are described in more detail below with reference to exemplary embodiments illustrated in the drawings, in which:

FIG. 1 is a sectional view of an exemplary converter station;

FIG. 2 shows an exemplary design of an optoelectronic current sensor, in conjunction with a sensor fiber head;

FIG. 10 is a sectional view of a third exemplary embodiment of a sensor head; and FIG. 11 is a sectional view along line XI-XI of FIG. 10.

DETAILED DESCRIPTION

Figure 3:
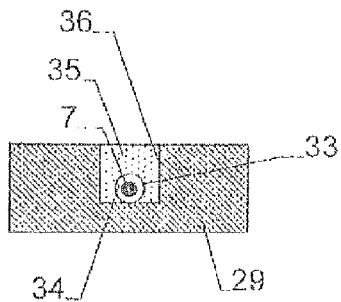
FIG. 3 is a sectional view of an exemplary carrier strip with a fiber.

An exemplary high voltage AC/DC or DC/AC converter station is disclosed with a current sensor that is easy to set up and to maintain.

As disclosed herein, a high voltage AC/DC or DC/AC converter station can include a sensing fiber and an optoelectronic module constituting means for measuring the current via the Faraday effect in a sensing fiber. The sensing fiber can be arranged at the base of the bushing or on the wall surrounding the base of the bushing. This design can allow placement of the fiber substantially at ground potential and at a location where it can be reached easily (e.g., for installation or maintenance work).

The sensing fiber can be embedded in a flexible sensing strip and operated in reflection. The sensing strip can be housed in a modular sensor head. The sensor head can be attached to the bushing or to the building wall supporting the bushing.

The principle of DC transmission lies in converting AC to DC in an AC/DC converter station, transmitting the power in a DC bipolar line and converting the power back to AC in a DC/AC converter station (Ref. 12).

A converter station 1 as shown in FIG. 1 can include (e.g., consist of) an AC yard with AC filters and breaker arrangement, converter transformers, thyristor converters 2 and a DC yard with smoothing reactor and DC filters. The thyristor converters are enclosed in a hall 3. High-voltage wall bushings 5 are used to connect the thyristor converters in hall 3 to the outdoor equipment in the AC and DC yards.

Each bushing 5 comprises an axial conductor 4 for leading the DC current through a wall 3a of hall 3. It further comprises a base 5*a*, which is connected to wall 3*a* and is therefore at ground potential. A first and a second arm 5*b*, 5*c* extend from axial end faces 5*f*, 5*g* of base 5*a* and include (e.g., consist of) two insulating tubes 5*d* surrounding conductor 4 and being provided with sheds 5*e* at their outer surface as known to the person skilled in the art. Each arm 5*b*, 5*c* carries a connecting electrode 5*i* for connecting bushing 5 to high voltage cables.

Sensor Head Placement:

Known current transducers have previously been located at high-voltage potential at the entrance of the DC transmission line and inside the hall between the DC wall bushing and the converter arrangement.

In the present disclosure, the sensor head 6*a* of current sensor 6, which contains the sensing fiber 7 as described below, is arranged at base 5*a* of bushing 5 and/or on wall 3*a* around base 5*a*. This location can have several exemplary advantages:

- The sensor head 6*a* comprising the sensing fiber 7 and thus the fiber cable between the head and the sensor electronics are at ground potential. Therefore, no high-voltage proof cable or insulator pole is needed.
- The sensor can be mounted or dismounted without interfering with the HVDC power line.
- Since the sensor head is all-dielectric, there is no particular distortion of electric field distribution at the bushing.
- The sensor can be arranged inside hall 3 and therefore indoors and thus does not need any weatherproof packaging.
- Retrofit installation is possible.

In the exemplary embodiment of FIG. 1, sensor head 6*a* and therefore sensing fiber 7 are arranged on the indoor axial end face 5*f* of base 5*a*. If outdoor mounting is acceptable, sensor head 6*a* may also be arranged on the outdoor axial end face 5*g* of base 5*a*. In yet another exemplary embodiment, as described below, sensor head 6*a* can be arranged along the circumference 5*h* of base 5*a* (e.g., along the surface of base 5*a* that is facing away from conductor 4; dotted lines 9*b*). Sensor head 6*a* may also be embedded in base 5*a*, as indicated by dotted lines 9*a* in FIG. 1.

Sensor head 6*a* may be supported by bushing 5 itself or by the wall 3*a*. If it is mounted to wall 3*a*, it is for example located radially outwards from base 5*a* where the electrical fields are lowest. A possible location of sensor head 6*a* arranged on wall 3*a* is indicated in dotted lines in FIG. 1 under reference number 9*b*.

A location of sensor head 6*a* and therefore fiber 7 depends, for example, on the particular diameter of the bushing, the resulting diameter of the fiber coil, and the type of sensing fiber used.

An exemplary sensing fiber 7 is a low-birefringent single-mode fiber. Here, relatively large loop diameters can be used (e.g. a minimum diameter of 40 cm, but preferably larger than for example 60 cm), if the bend-induced fiber stress is not removed by thermal annealing. Another exemplary fiber is a so-called highly birefringent spun fiber (Ref. 7). This type of fiber can be used for small fiber loop radii without thermal annealing of the sensor fiber.

Current Sensor:

As mentioned above, the current sensor makes use of the magneto-optic effect (Faraday effect) in fiber 7. An exemplary sensor version is an interferometric sensor as illustrated in FIG. 2 and as described in Refs. 1-4.

The optoelectronic module 8 comprises a light source 10, the light of which is depolarized in a depolarizer 11, subsequently sent through a fiber coupler 12 to a polarizing phase modulator 13. Polarizing phase modulator 13 splits the light up into two paths, sends one of them through a 90° splice 14 and combines them back in a polarization-maintaining fiber coupler 15. The two resulting linearly polarized light waves with orthogonal polarization directions are sent through a polarization maintaining (pm) connecting fiber 16. A short section of pm fiber (e.g. an elliptical-core fiber) serves as a quarter-wave retarder 17 and converts the linearly polarized waves into left and right circularly polarized waves. The circular waves propagate through sensing fiber 7, are reflected at a reflector 18 at its far end and then return with swapped polarizations. The retarder 17 converts the circular waves back to orthogonal linear waves. The magnetic field of the current produces a differential phase shift $\Delta\phi$ between left and right circularly polarized light waves. The returning linear waves have the same phase shift $\Delta\phi$. $\Delta\phi$ is proportional to the current. The phase shift $\Delta\phi$ is detected by a technique as known from fiber gyroscopes (Ref. 5, 6).

It should be noted, though, that the disclosure is not restricted to interferometric fiber-optic current sensors as shown in FIG. 2, but may be used as well for others, for example polarimetric sensors. In a polarimetric sensor the magneto-optic effect is detected as a rotation of a linearly polarized light wave.

Placement of Optoelectronic Module:

Optoelectronic module 8 including the light source, the signal detection and processing unit as well as interface electronics are, for example, located in hall 3. A fiber cable 39 protects the connecting fiber between the sensor head and the electronics. For example, the connecting fiber has an optical connector so that the sensor head and electronics can be separated (e.g., during transport and installation).

Sensor Head Design:

a) Low Birefringent Sensing Fiber

Figure 5:
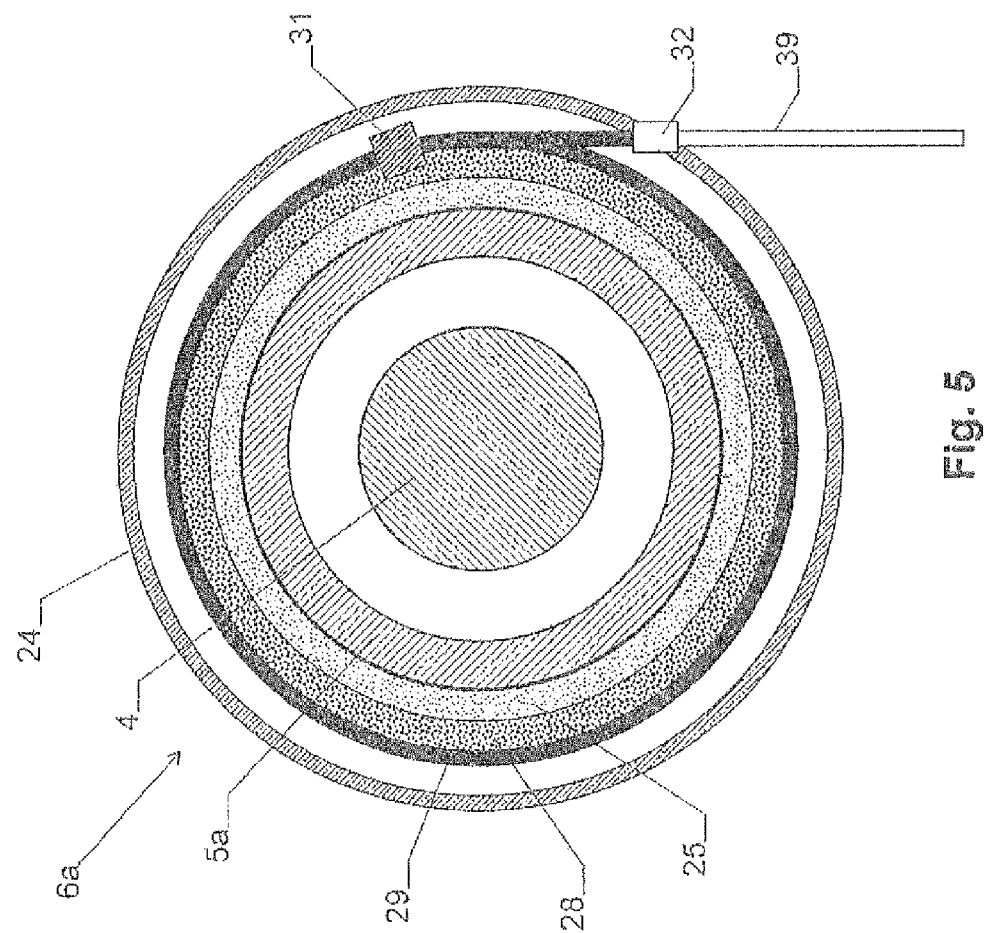
FIG. 5 is a sectional view along line V-V of FIG. 4.
Figure 4:
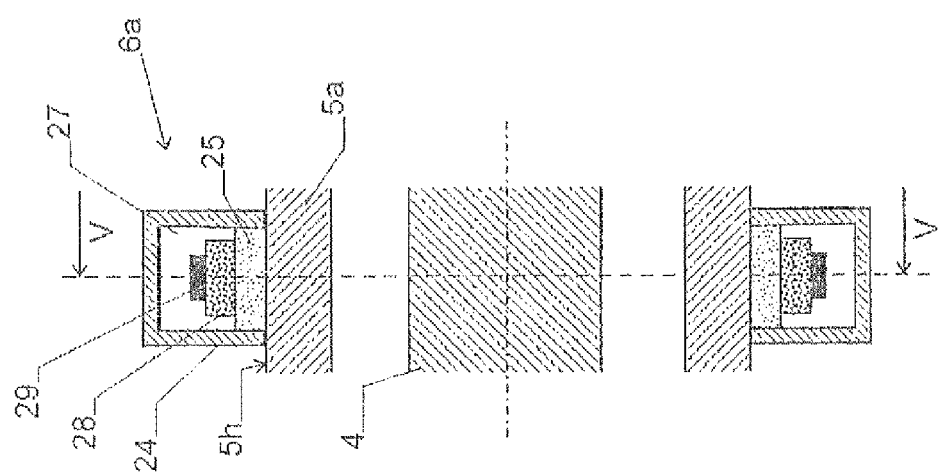
FIG. 4 is a sectional view parallel to the longitudinal axis of an exemplary bushing.

FIGS. 4 and 5 show an exemplary embodiment for a sensor head 6*a* that allows mounting of sensing fiber 7 along circumference 5*h* of base 5. As can be seen, an outward projecting housing 24 is mounted to base 5*a* and encloses a support body 25 and an annular channel or annual chamber 27. Support body 25 is cylindrical. In channel 27, a foam strip 28 is mounted to support body 25 and in turn carries a sensing strip 29. As described below, sensing fiber 7 is arranged in the sensing strip 29.

Support body 25 may be an integral part of the housing 24 or a part attached thereto by glueing, screwing, and so forth.

As can, in particular, be seen in FIG. 5, at least one clamp 31 is provided for holding sensing strip 29 in place and, in particular, for closing the fiber loop (see below). Further, an adapter 32 is mounted to sensor head 6*a* for connecting sensing strip 29 to the fiber cable 39 of connecting fiber 16.

As mentioned above, sensing fiber 7 can be packaged in a flexible sensing strip 29, for example of fiber re-enforced epoxy resin, as disclosed in Ref. 1 and as shown in FIG. 3 of the present application. The bare sensing fiber 7 (without coating) and the retarder 17 are accommodated in a thin fused silica capillary 33, as described in Ref. 8. Capillary 33 is coated for protection with, for example, a thin polyimide coating, and is filled with a lubricant 34 to avoid friction between the fiber and the capillary walls. The capillary is embedded in silicone or a resin 35 in a groove 36 of sensing strip 29. Groove 36 may, for example, be of rectangular or triangular shape. For example, the longitudinal capillary axis is in the neutral plane of sensing strip 29 (at half the thickness of the strip) so that bending the strip does not strain the capillary.

This way of fiber packaging avoids any packaging related stress on the fiber over a wide range of temperatures and results in high stability and accuracy of the sensor. Sensing strip 29 serves as a robust mechanical protection of the capillary and also ascertains a reproducible azimuth angle of retarder 17 and the fiber, a further prerequisite for high scale factor repeatability, see Ref. 1 and Ref. 9. For example, a defined azimuth angle can be important if the orientation of retarder 17 deviates from 90°. Such a deviation may be the result of manufacturing tolerances or may be introduced on purpose, here for temperature compensation of the Faraday effect (see below).

Sensing fiber 7 forms an integer number of loops around conductor 4 to ascertain that the sensor measures a closed path integral of the magnetic field. The signal is thus independent of the magnetic field distribution and unaffected by currents flowing outside the fiber coil. In order to properly close the sensing strip, the strip has markers or similar separated by the length of the sensing fiber. For example, the markers are at or near the sensing fiber ends. The sensing strip is mounted in sensor head 6a on the annular support body 25 in such as way that the markers coincide (e.g., such that they are at the same circumferential position). Clamp 31 keeps the overlapping strip sections in place. Foam strip 28 may be inserted between the sensing strip and the main support body to avoid stress as a result of differential thermal expansion.

Figure 6:
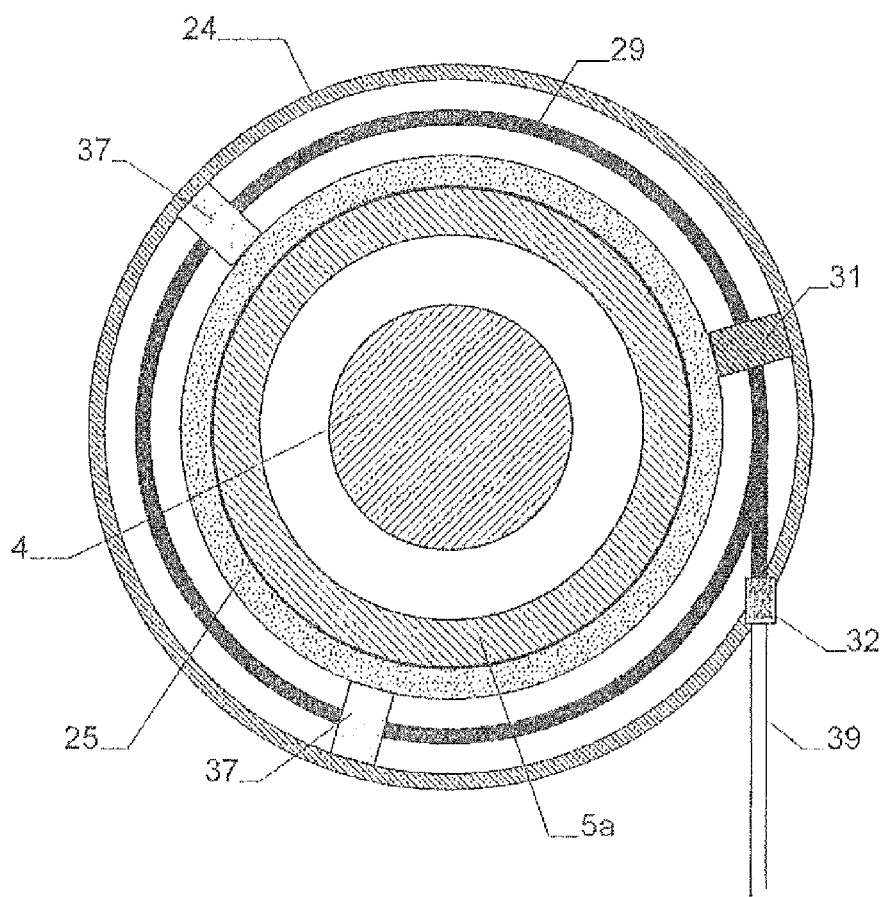
FIG. 6 is a sectional view of a second exemplary embodiment of a sensor head.

In an alternative exemplary embodiment, as shown in FIG. 6, sensing strip 29 may be essentially loose and supported only at some locations by a plurality of spaced-apart, radially extending support members 37, one of which can be clamp 31, with clamp 31 being used to close the loop at the markers mentioned above. The support members 37 hold sensing fiber 7 in sensing strip 29 suspended at a distance from support body 25.

In general, sensor head 6a can form a modular structure that can be added after the assembly of the bushing.

For example, the cable/sensing strip adapter 32 that connects the cable 39 of connecting fiber 16 is mounted to housing 24 of sensor head 6a so that it also acts as strain relief for the cable 39.

Figure 7:
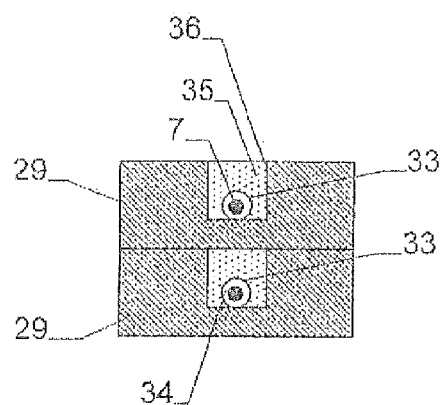
FIG. 7 is a sectional view of an exemplary sensing strip having two windings.

At high rated currents a single fiber loop may already be sufficient. In fact, a sensor with a single loop can be a particularly advantageous embodiment. If more loops are desired, sensing strip 29 may be mounted in two or more superimposed loops as shown in FIG. 7, where sensing strip 29 holds a single sensing fiber 7, which has substantially the same length as sensing strip 29, and sensing strip 29 is wound several times around conductor 4. An exemplary advantage of this scheme is that the sensor can easily be added to the already assembled bushing.

Figure 8:
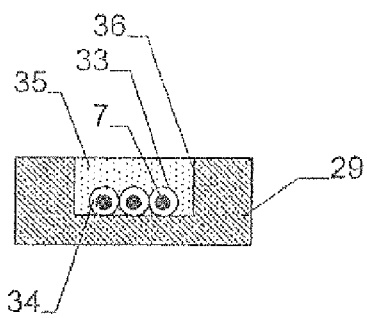
FIG. 8 is a sectional view of an exemplary sensing strip with several embedded fiber windings.

Alternatively, the sensor may have only one loop of sensing strip 29 containing several loops of capillary 33 with sensing fiber 7 inside, as shown in FIG. 8. Here, it should be ensured that the sensing fiber length is an integer multiple of the sensing strip length.

For example, the temperature dependence of the Faraday effect (Verdet constant, $7 \times 10^{-5}$ °C.$^{-1}$) is inherently compensated as described in Ref. 10 and Ref. 3. Here, retarder 17 in front of sensing fiber 7 is prepared such that it introduces an extra contribution to the temperature dependence which compensates the temperature dependence of the Verdet constant. However, a further contribution to the temperature dependence of the sensor arises from the fact that the thermal expansion of sensing strip 29 (e.g., about $10^{-5}$ °C.$^{-1}$) is larger than the thermal expansion of sensing fiber 7 ($0.5 \times 10^{-6}$ °C.$^{-1}$). As a result the fiber coil is perfectly closed (e.g., the ends of the sensing fiber are at the same radial position) only at a certain temperature, such as at room temperature. As the fiber 7 in capillary 33 does not follow the thermal expansion of the sensing strip 29, the fiber ends overlap somewhat below room temperature whereas a small tangential gap develops between the ends above room temperature. An overlap slightly increases the sensitivity of the sensor, whereas a gap slightly reduces the sensitivity. The effect thus is opposite to the temperature dependence of the Verdet constant. The combined temperature dependence is then $6 \times 10^{-5}$ °C.$^{-1}$ if the thermal expansion of the sensing strip 29 is $10^{-5}$ °C.$^{-1}$. Retarder 17 is, for example, prepared such that it compensates the combined temperature dependence (e.g., retarder 17 is set such that its influence corresponds to $-6 \times 10^{-5}$ °C.$^{-1}$).

Figure 9:
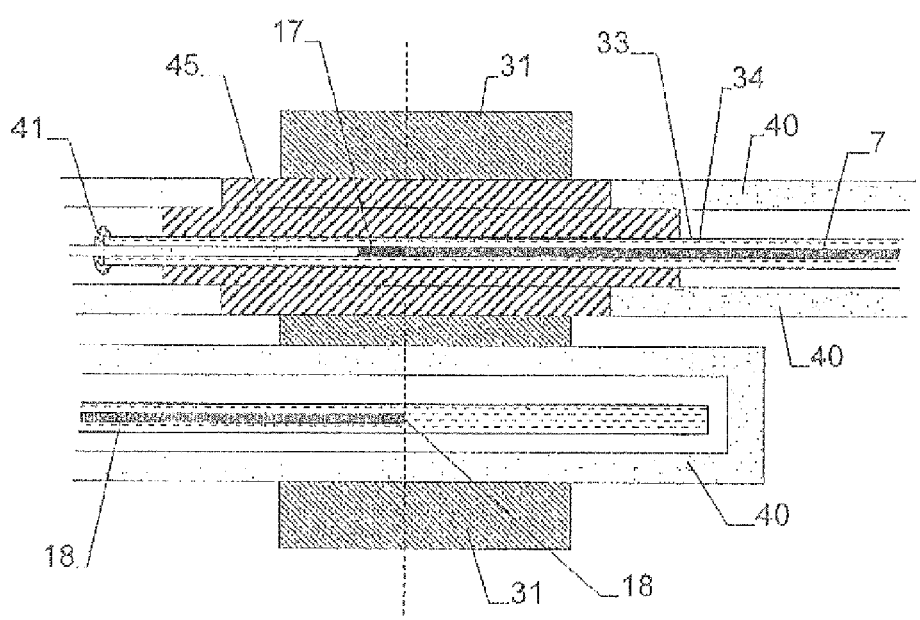
FIG. 9 is a sectional view through an exemplary clamp and adapter of an alternative design.

As an alternative to the epoxy strip the sensing strip can also be formed by an appropriate hollow-tube fiber cable 40 as shown in FIG. 9, which shows a radial section of such a sensor head in the region of clamp 31. Fiber cable 40 is again equipped with markers and/or clamps which allow to reproducibly close the fiber coil.

The coil may again include (e.g., consist of) one or several loops. If a reproducible retarder/fiber azimuth angle is desired, capillary 33 at or near the location of retarder 17 is mounted in an appropriate adapter tube 45. A seal 41 at the capillary ends ensures that the fiber follows any adapter tube and capillary rotation. Clamp 31 closing the loop also defines the proper fiber azimuth.

FIG. 9 shows, in its upper half, the start section of the coil of cable 40 and, in its lower half, the end section of cable 40 after one loop. As can be seen, both are commonly held in clamp 31.

It goes without saying that essentially the same type of sensor head packaging as described for example, with respect to FIGS. 4, 5 can be used if the sensor head is placed at the alternative locations (3a, 5f) or if it is embedded in base 5a as mentioned above.

b) Spun Highly Birefringent Sensing Fiber

Instead of a fiber with low intrinsic birefringence the fiber may be a spun highly birefringent fiber as known from Ref. 7. This type of fiber is more stress tolerant than a low birefringent fiber and therefore may be embedded into the fiber-reinforced epoxy strip or protected in a fiber cable without a capillary. Alternatively, it may be embedded in a capillary in the same way as low birefringent fiber described above.

c) Flint Glass Fiber

A further exemplary alternative is the use of flint glass fiber (Ref. 13). Flint glass fiber has very small stress optic coefficients and therefore is also rather stress tolerant. Like the spun highly birefringent fiber it may be embedded into the fiber-reinforced epoxy strip or may be protected in a fiber cable without a capillary.

d) Annealed Sensing Fiber

At small loop diameters (e.g., loop diameters of less than 40-60 cm) or if a larger number of fiber loops is used, the fiber may be thermally annealed as described in Ref. 3. In this case the fiber coil is packed in a rigid ring-shaped housing.

Such an embodiment is shown in FIGS. 10, 11, where the ring-shaped housing extending around conductor 4 is designated by 42 and the fiber by 43. The housing has an inner wall 42a facing base 5a, an outer wall 42b facing outwards, as well as two axial walls 42c, 42d extending perpendicularly thereto, and it encloses an annular space for receiving the fiber 43 or a capillary enclosing the fiber. The space enclosed by housing 42 can optionally be filled with an embedding material 44.

A capillary containing a non-annealed low birefringent sensing fiber, a spun highly birefringent sensing fiber or a flint glass fiber may be packaged in a rigid ring-shaped housing (e.g., without using a sensing strip, as well). For example, the capillary or the fiber is then embedded in a soft material such as silicone gel or foam. The spun highly birefringent sensing fiber and the flint glass fiber may be placed in the housing 42 without capillary and with or without any further embedding material 44 (FIG. 10).

Redundant Sensors:

For redundancy, the sensing strip may contain two or more sensing fibers, each connected by a connecting fiber 16 to is own optoelectronics unit. Each sensing fiber may be accommodated in a separate capillary as described above or a single capillary may contain two or more sensing fibers. For example, there is a common cable 39 for the connecting fibers 16. At the opto-electronics end of the cable the individual fibers 16 are fanned out to the individual opto-electronics units.

A further exemplary alternative is that there are two or more sensing strips of independent sensors mounted on a common support body 25.

A still further exemplary alternative is that two or more independent sensor heads are mounted at the bushing.

Exemplary embodiments as disclosed herein can provide several aspects of improvement:

- An installation concept of a fiber-optic current sensor at a converter station for HVDC.
- The potential for indoor placement of the sensor head to avoid weather-proof packaging.
- The sensor head can be arranged at ground potential to avoid the need of a high-voltage-proof fiber link.
- Methods of arranging and packaging the sensing fiber of the fiber-optic current sensor for current measurement at HVDC-substations are described.
- The disclosure makes it possible to easily retrofit an installation of a current sensor.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The following documents are incorporated herein by reference in their entireties:

1. WO 2005/111633
2. EP 1 154 278
3. K. Bohnert, G. Gabus, J. Nehring, and H. Brändle, "Temperature and vibration insensitive fiber-optic current sensor", J. of Lightwave Technology 20(2), 267-276 (2002).
4. K. Bohnert, H. Brändle, M. Brunzel, P. Gabus, and P. Guggenbach, "Highly accurate fiber-optic dc current sensor for the electro-winning industry", IEEE/IAS Transactions on Industry Applications 43(1), 180-187, 2007.
5. R. A. Bergh, H. C. Lefevre, and H. J. Shaw, "An overview of fiber-optic gyroscopes", J. Lightw. Technol., 2, 91-107, 1984.
6. "The fiber-optic gyroscope", Nerve Lefevre, Artech House, Boston, London, 1993.
7. R. I. Laming and D. N. Payne, "Electric current sensors employing spun highly birefringent optical fibers", J. Lightw. Technol., 7, no. 12, 2084-2094, 1989.
8. EP 1 512 981
9. K. Bohnert, P. Gabus, J. Nehring, H. Brändle, M. Brunzel, "Fiber-optic high current sensor for electrowinning of metals", Journal of Lightwave Technology, 25(11), 2007.
10. EP 1 115 000
11. G. Fernquist, "The measurement challenge of the LHC project", IEEE Trans. Instrum. Meas. 48(2), 462, 1999.
12. G. Asplund, "Ultra High Voltage Transmission", ABB Review, 2/2007.
13. K. Kurosawa, S. Yoshida, and K. Sakamoto, "Polarization properties of flint glass fiber", J. Lightw. Technol., 13, (7), pp. 1378-1383, 1995.

REFERENCE NUMBERS

1 converter station
2 converter
3 hall
4 conductor
5 bushing
5$a$ base
5$b$, 5$c$ arms
5$d$ insulating tubes
5$e$ sheds
5$f$, 5$g$ axial end faces
5$h$ circumference of base
5$i$ connecting electrodes
6 current sensor
6$a$ sensor head
7 sensing fiber
8 optoelectronic module
9$a$, 9$b$ alternative sensor head location
10 light source
11 depolarizer
12 fiber coupler
13 phase modulator
14 90°-splice
15 polarization-maintaining fiber coupler
16 connecting fiber
17 quarter-wave retarder
18 reflector
24 housing
25 support body
27 channel
28 foam strip
29 sensing strip
31 clamp
32 adapter
33 capillary
34 lubricant
35 silicone/resin
36 groove
37 support members
39 cable of connecting fiber 16
40 fiber cable
41 seal
42 housing
42$a$-$d$ housing walls
43 fiber or capillary with fiber
44 embedding material
45 adapter tube

What is claimed is:

1. A high-voltage AC/DC or DC/AC converter station, comprising:
   a converter that converts high AC voltage to high DC voltage or vice versa;
   a hall arranged around said converter;
   a bushing having a conductor for leading high DC voltage through a wall of said hall, said bushing comprising a base connected to said wall and arms extending from opposite sides of said base and carrying connecting electrodes; and
   at least one current sensor for measuring a current through said conductor at said high DC voltage, wherein said current sensor comprises a sensor head that includes an optical sensing fiber and an optoelectronic module, the sensor head having a housing mounted to said base or wall, an annular support body mounted on said base or wall within said housing, and a foam strip mounted to said support body, the sensor head being configured for measuring said current via a Faraday effect in said sensing fiber, wherein said sensing fiber is looped around said conductor and arranged at said base and/or said wall around said base, said sensor head forms a modular structure that can be added after assembly of the bushing, said sensing fiber forms an integer number of loops around said conductor so that the sensor measures a closed path integral of the magnetic field; and said sensor head is arranged at ground so that no high-voltage-proof fiber link is used.

2. The converter station of claim 1, wherein said sensing fiber is arranged inside said hall.

3. The converter station of claim 1, wherein said sensing fiber is arranged along a circumference of said base.

4. The converter station of claim 1, wherein said sensing fiber is arranged on an axial end face of said base.

5. The converter station of claim 1, wherein said sensing fiber is arranged within said base.

6. The converter station of claim 1, comprising:
a plurality of spaced-apart support members holding said sensing fiber at a distance from said support body.

7. The converter station of claim 1, wherein said sensing fiber is packaged in a capillary and said capillary is mounted in a flexible sensing strip.

8. The converter station of claim 7, comprising:
a clamp holding a start section and an end section of said carrier strip.

9. The converter station of claim 7, wherein said sensing strip holds a single sensing fiber and is wound several times around said conductor.

10. The converter station of claim 7, wherein the sensing strip forms a single loop around said conductor and contains several loops of sensing fiber.

11. The converter station of claim 1, wherein said sensing fiber is a non-annealed fiber, an annealed fiber, a highly birefringent spun fiber or a flint glass fiber.

12. The converter station of claim 1, comprising:
several redundant sensing fibers.

13. The converter station of claim 1, comprising:
a single loop of sensing fiber.

14. The converter station of claim 8, wherein said sensing strip holds a single sensing fiber and is wound several times around said conductor.

15. The converter station of claim 8, wherein the sensing strip forms a single loop around said conductor and contains several loops of sensing fiber.

16. The converter station of claim 8, wherein said sensing fiber is a non-annealed fiber, an annealed fiber, a highly birefringent spun fiber or a flint glass fiber.

17. The converter station of claim 16, comprising:
several redundant sensing fibers.

18. The converter station of claim 16, comprising:
a single loop of sensing fiber.

19. The converter station of claim 1, wherein a connecting fiber is present between the sensor head and the optoelectronic module, and the connecting fiber has an optical connector so that the sensor head and the optoelectronic module can be separated, during transport and installation.

20. The converter station of claim 1, wherein the current sensor is an interferometric sensor operated in reflection.

21. The converter station of claim 1, comprising:
a ring-shaped housing extending around the conductor, the housing having an inner wall facing said base, an outer wall facing outwards, as well as two axial walls extending perpendicularly thereto, and enclosing an annular space for receiving a capillary enclosing the fiber, the space enclosed by the housing being filled with an embedding material including silicone gel or foam.

22. The converter station of claim 1, wherein the sensing fiber is in a capillary and a retarder arranged in front of said sensing fiber is prepared to compensate a combined temperature dependence of the Verdet constant of said sensing fiber and of a thermal expansion of a sensing strip being larger than a thermal expansion of said sensing fiber.

23. The converter station of claim 22, wherein a temperature dependence of the Verdet constant is $7 \times 10^{-5 \circ} \text{C}.^{-1}$, a temperature dependence of the thermal expansion of the sensing strip is $10^{-5 \circ} \text{C}.^{-1}$ and of the sensing fiber is $0.5 \times 10^{-6 \circ} \text{C}.^{-1}$ resulting in a variation of sensitivity of the sensor opposite to the temperature dependence of the Verdet constant and to a combined temperature dependence of $6 \times 10^{-5 \circ} \text{C}.^{-1}$, and the retarder is set such that its influence corresponds to $-6 \times 10^{-5 \circ} \text{C}.^{-1}$.

24. The converter station of claim 1, wherein if said sensing fiber is a spun, highly birefringent sensing fiber or flint glass fiber, said sensing fiber is embedded into a strip or is protected in a fiber cable without a capillary.

25. The converter station of claim 1, comprising:
a ring-shaped housing extending around the conductor, the housing having an inner wall facing said base, an outer wall facing outwards, as well as two axial walls extending perpendicularly thereto, and enclosing an annular space for receiving the fiber, the space enclosed by the housing being filled with an embedding material including silicone gel or foam.

26. The converter station of claim 1, comprising:
an ac yard having ac filters and a breaker arrangement, converter transformers, thyristor converters and a dc yard with a smoothing reactor and dc filters.

27. The converter station of claim 1, comprising:
equipment for converting between high voltage DC and AC currents and being used for electric power transmission at DC voltages in the order or several 100 kV.

28. A DC transmission system comprising:
an AC/DC converter station arranged in a hall for converting AC to DC and having a first fiber-optic current sensor for measuring a current through said conductor at said high DC voltage, wherein said first current sensor comprises a sensor head that includes an optical sensing fiber and an optoelectronic module, the sensor head having a housing mounted to said base or wall, an annular support body mounted on said base or wall within said housing, and a foam strip mounted to said support body, the sensor head being configured for measuring said current via a Faraday effect in said sensing fiber;

a bushing having a conductor for leading high DC voltage from the AC/DC through a wall of said hall, said bushing including a base connected to said wall and arms extending from opposite sides of said base and carrying connecting electrodes;

a DC bipolar power line for power transmission, the power line being connected to an end of the bushing that extends outside the hall; and a DC/AC converter station converting power back to AC and having a second fiber-optic current sensor for measuring a current through said conductor at said high DC voltage, wherein said second current sensor comprises a sensor head, which contains an optical sensing fiber and an optoelectronic module for measuring said current via a Faraday effect in said sensing fiber.

29. A fiber-optic current sensor, for use in a converter station of claim 1, comprising:
a sensor head which contains an optical sensing fiber arranged in a capillary;
an optoelectronic module for measuring a current through a Faraday effect in said sensing fiber, wherein said sensing fiber forms an integer number of loops around a conductor so that the sensor measures a closed path integral of the magnetic field; and
a retarder arranged in front of said sensing fiber that compensates for a combined temperature dependence of a Verdet constant of said sensing fiber and for a thermal expansion of a sensing strip that is larger than a thermal expansion of said sensing fiber.

30. The fiber-optic current sensor of claim 29, wherein a temperature dependence of the Verdet constant is $7 \times 10^{-5 \circ}$ $C.^{-1}$, a temperature dependence of the thermal expansion of the sensing strip is $10^{-5 \circ} C.^{-1}$ and of the sensing fiber is $0.5 \times 10^{-6 \circ} C.^{-1}$ resulting in a variation of sensitivity of the sensor that is opposite to the temperature dependence of the Verdet constant and to a combined temperature dependence of $6 \times 10^{-5 \circ} C.^{-1}$, and wherein the retarder is set such that its influence corresponds to $-6 \times 10^{-5 \circ} C.^{-1}$.

* * * * *